(12) United States Patent
Nieh et al.

(10) Patent No.: US 9,985,105 B2
(45) Date of Patent: May 29, 2018

(54) METHOD OF MANUFACTURING A PMOS TRANSISTOR COMPRISING A DUAL WORK FUNCTION METAL GATE

(71) Applicant: Nanya Technology Corp., Taoyuan (TW)

(72) Inventors: Shin-Yu Nieh, Taoyuan (TW);
Tieh-Chiang Wu, Taoyuan (TW);
Wei-Ming Liao, Taoyuan (TW);
Jei-Cheng Huang, Taoyuan (TW);
Hai-Han Hung, Taoyuan (TW);
Hsiu-Chun Lee, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days. days.

(21) Appl. No.: 15/199,413

(22) Filed: Jun. 30, 2016

(65) Prior Publication Data
US 2016/0351678 A1    Dec. 1, 2016

Related U.S. Application Data

(62) Division of application No. 13/846,169, filed on Mar. 18, 2013, now abandoned.

(51) Int. Cl.
| | |
|---|---|
| *H01L 29/49* | (2006.01) |
| *H01L 21/28* | (2006.01) |
| *H01L 29/66* | (2006.01) |
| *H01L 29/51* | (2006.01) |

(52) U.S. Cl.
CPC .... *H01L 29/4966* (2013.01); *H01L 21/28079* (2013.01); *H01L 21/28088* (2013.01); *H01L 21/28105* (2013.01); *H01L 29/4958* (2013.01); *H01L 29/4983* (2013.01); *H01L 29/517* (2013.01); *H01L 29/66545* (2013.01); *H01L 29/66553* (2013.01); *H01L 29/495* (2013.01); *H01L 29/518* (2013.01)

(58) Field of Classification Search
CPC ............ H01L 29/4983; H01L 29/4958; H01L 29/66553; H01L 29/66545; H01L 21/28105; H01L 21/28088; H01L 21/28079
See application file for complete search history.

(56) References Cited

U.S. PATENT DOCUMENTS

| | | | | |
|---|---|---|---|---|
| 7,666,727 | B2 * | 2/2010 | Doyle | ............... H01L 21/28079 438/197 |
| 2010/0041225 | A1 * | 2/2010 | Anderson | ......... H01L 21/28105 438/592 |
| 2011/0156107 | A1 * | 6/2011 | Bohr | ................. H01L 21/76831 257/288 |

* cited by examiner

*Primary Examiner* — Marcos D Pizarro

(57) ABSTRACT

The invention provides a method for fabricating a semiconductor device, including: forming a dummy gate on a substrate, forming an inter-layer dielectric layer (ILD) on the dummy gate and the substrate, forming a metal layer on the upper surface of the dummy gate, removing the dummy gate to form a trench in the inter-layer dielectric layer (ILD), conformally forming a gate dielectric layer in the trench, conformally forming a first conductive type metal layer on the gate dielectric layer, anisotropic etching the first conductive type metal layer and the gate dielectric layer over the metal layer to form a gap in the inter-layer dielectric layer (ILD), and filling a second conductive type metal layer in the gap.

15 Claims, 5 Drawing Sheets

METHOD OF MANUFACTURING A PMOS TRANSISTOR COMPRISING A DUAL WORK FUNCTION METAL GATE

CROSS REFERENCE TO RELATED APPLICATION

This application is a Divisional of pending U.S. patent application Ser. No. 13/846,169, filed Mar. 18, 2013 and entitled "SEMICONDUCTOR DEVICE AND METHOD FOR FABRICATING THE SAME," which is hereby incorporated by reference.

BACKGROUND OF THE DISCLOSURE

Field of the Disclosure

The present disclosure relates to a semiconductor device, and in particular relates to a semiconductor device having a dual work function metal gate and method for fabricating the same.

Description of the Related Art

In the course of the semiconductor integrated circuit (IC) evolution, functional density (i.e., the number of interconnected devices per chip area) has generally increased while geometry size (i.e., the component (or line) that can be created using a fabrication process) has decreased.

Specifically, as the dimension of the complementary metal-oxide-semiconductor (CMOS) devices decreases, short channel effect is increased. Thus, the threshold voltage ($V_{th}$) of CMOS devices is undesirably reduced.

There are several methods to increase the threshold voltage ($V_{th}$), such as more channel doping, S/D doping reduction, increase halo implants, etc. However, the conventional methods have some drawbacks, for example, junction leakage is increased, drain current saturation (IDs) is increased, and junction capacitance is high.

Mid-gap materials having a work function of about 4.6 eV (such as TiN, Ta, W) (near the mid-gap of silicon) may be used as the gate. However, the undesirably gate-induced drain leakage (GIDL) still exists.

Therefore, there is a need to develop a semiconductor device having a high threshold voltage ($V_{th}$) and a low gate-induced drain leakage (GIDL).

BRIEF SUMMARY OF THE DISCLOSURE

The invention provides a semiconductor device, comprising: a substrate; a U-shaped gate dielectric layer formed on the substrate; and a dual work function metal gate layer on the inner surface of U-shaped gate dielectric layer, wherein the dual work function metal gate layer comprises a first conductive type metal layer and a second conductive type metal layer.

The invention also provides a method for fabricating a semiconductor device, comprising: providing a substrate; forming a dummy gate on the substrate; forming an inter-layer dielectric layer (ILD) on the dummy gate and the substrate; performing a first chemical mechanical polishing (CMP) process to the inter-layer dielectric layer (ILD) to expose an upper surface of the dummy gate; forming a metal layer on the upper surface of the dummy gate; removing the dummy gate to form a trench in the inter-layer dielectric layer (ILD); conformally forming a gate dielectric layer in the trench; conformally forming a first conductive type metal layer on the gate dielectric layer; removing the first conductive type metal layer and the gate dielectric layer over the metal layer to form a gap in the inter-layer dielectric layer (ILD) and to expose a portion of the gate dielectric layer; filling a second conductive type metal layer in the gap, wherein the second conductive type metal layer is sandwiched between two first conductive type metal layers to form a dual work function metal gate layer; and performing a second chemical mechanical polishing (CMP) process to the second conductive type metal layer and the metal layer to expose an upper surface of the dual work function metal gate layer.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

The invention provides a semiconductor device having a dual work function metal gate structure.

FIGS. 1A-1H and 1H' show cross-sectional schematic representations of various stages of fabricating a semiconductor device 100 in accordance with an embodiment of the invention.

Figure 1A:
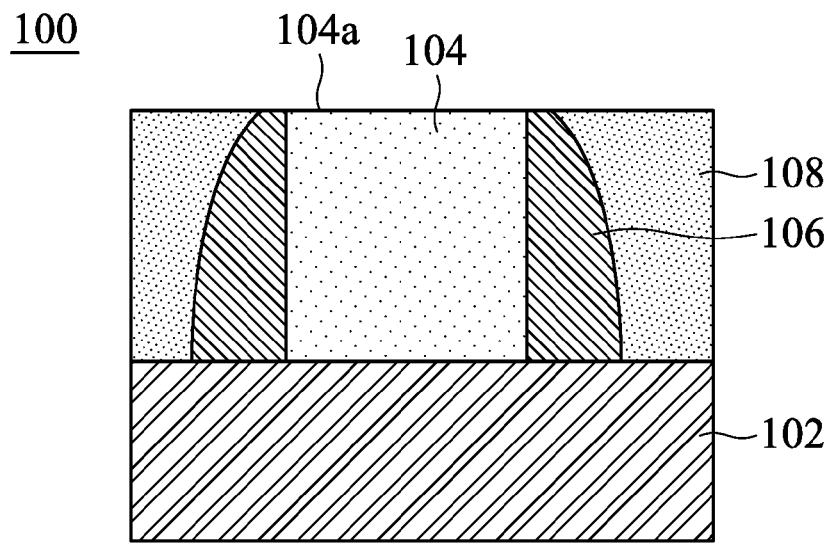
FIGS. 1A-1H and 1H' show cross-sectional schematic representations of various stages of fabricating a semiconductor device in accordance with an embodiment of the invention.

Referring to FIG. 1A, a substrate 102 is provided, such as a silicon substrate. The substrate 102 may alternatively include silicon germanium, gallium arsenic, or other suitable semiconductor materials. The substrate 102 may further include other features such as various doped regions, a buried layer, and/or an epitaxy layer. Furthermore, the substrate 102 may be a semiconductor on insulator such as silicon on insulator (SOI). In other embodiments, the semiconductor substrate 102 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

Additionally, an isolation structure (not shown) such as a shallow trench isolation (STI) feature, may be formed in the substrate 102 for isolating an active region in the substrate, as is known in the art. The isolation structure may be formed of silicon oxide, silicon nitride, silicon oxynitride, fluoride-doped silicate (FSG), and/or a low k dielectric material known in the art.

Then, a dummy gate 104 is formed on the substrate 102. The dummy gate 104 may comprise a doped or undoped poly-crystalline silicon (or amorphous silicon), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials or combinations thereof. In an embodiment, the dummy gate 104 is poly-silicon and may be formed by low-pressure chemical vapor deposition.

Next, an inter-layer dielectric layer (ILD layer) 108 is formed on the substrate 102 and the dummy gate 104. The inter-layer dielectric layer 108 may be formed by atomic layer deposition (ALD), physical vapor deposition (PVD), chemical vapor deposition (CVD), or other acceptable methods for forming an ILD layer 108. The inter-layer dielectric layer 108 may comprise doped or undoped silicon oxide, although other materials such as silicon nitride doped silicate glass, high-k materials, combinations of these, or the like, may alternatively be utilized.

Additionally, before forming the inter-layer dielectric layer 108, the spacers 106 may be formed on the substrate 102 and a sidewall of the dummy gate 104. The spacers 106 may be formed by blanket depositing one or more spacer layers (not shown) on the dummy gate 104 and the substrate 102. The spacers 106 may comprise SiN, oxynitride, SiC, SiON, oxide, and the like and may be formed by commonly used methods such as chemical vapor deposition (CVD), plasma enhanced CVD, sputter, and other methods known in the art. Note that in another embodiment, the spacers may not be formed.

The source/drain regions (not shown in FIG. 1A) may be formed within the substrate 102 on opposing sides of the dummy gate 104. Thus, the source/drain regions may be formed so as to define a channel region located beneath the dummy gate 104.

Referring to FIG. 1A again, a first chemical mechanical polishing (CMP) is performed to the inter-layer dielectric layer (ILD) 108 to expose an upper surface 104a of the dummy gate 104.

Figure 1B:
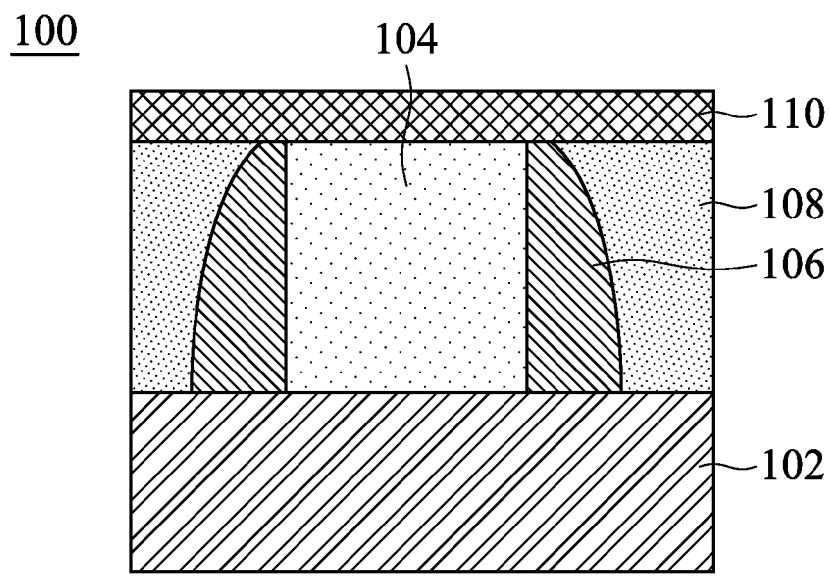

Referring to FIG. 1B, a metal layer 110 is formed on the upper surface 104a of the dummy gate 104. The metal layer 110 may be a $p^+$ metal layer or $n^+$ metal layer. The metal layer 110 may be formed by atomic layer deposition (ALD), physical vapor deposition (PVD), chemical vapor deposition (CVD), or other acceptable methods.

In one embodiment, when the semiconductor device is an PMOS device, the metal layer 110 is an $n^+$ metal layer. In another embodiment, when the semiconductor device is NMOS device, the metal layer 110 is a $p^+$ metal layer.

Figure 1C:
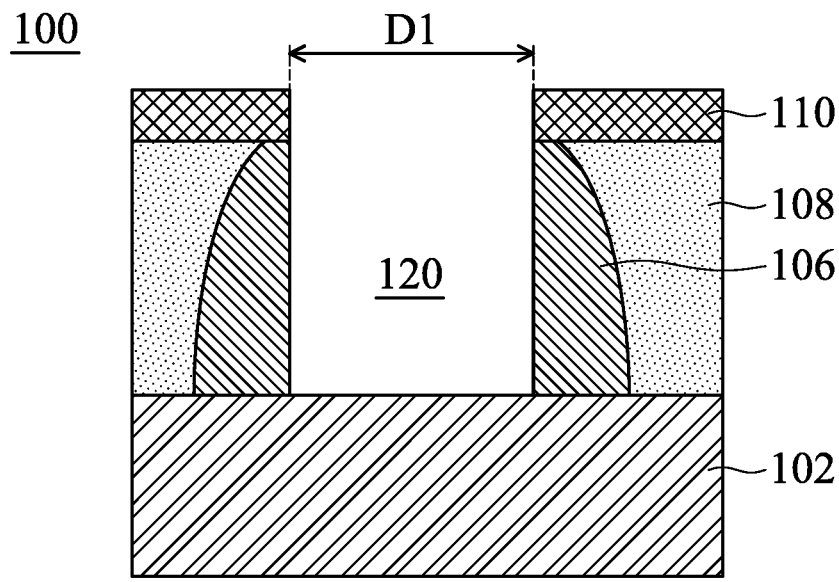

Referring to FIG. 1C, the dummy gate 104 is removed to form a trench 120 in the inter-layer dielectric layer 108, and the trench 120 has a depth of D1.

Figure 1D:
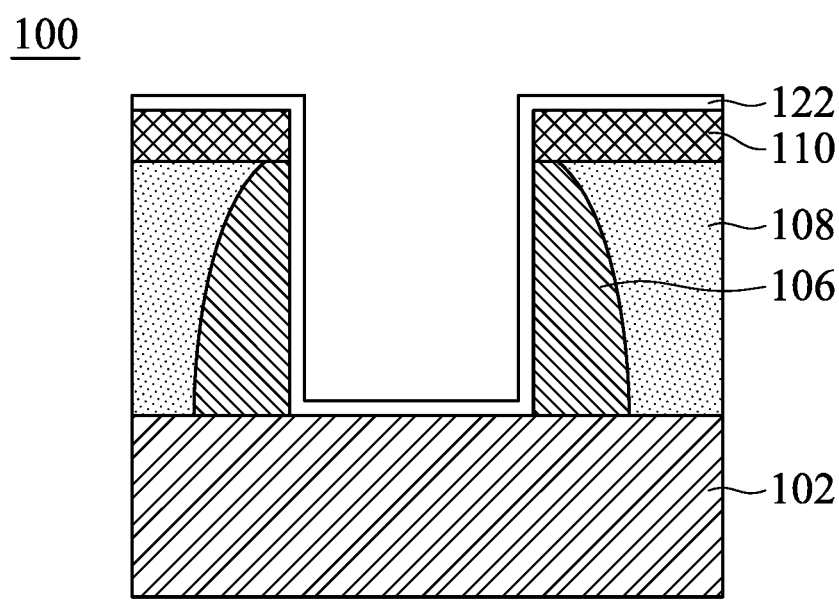

Referring to FIG. 1D, a gate dielectric layer 122 is conformally formed in the trench 120. The gate dielectric layer 122 may be formed by atomic layer deposition (ALD), chemical vapor deposition (CVD), or other acceptable methods. The gate dielectric layer 122 has a thickness of about 5-70 Å, preferably about 5-50 Å.

Additionally, the gate dielectric layer 122 comprises high-k dielectric material, such as $HfO_2$, $ZrO_2$, $TiO_2$, $Al_2O_3$, HfSiO, HfSiON, HfTaO, HfTiO, HfZrO or combinations thereof.

Figure 1E:
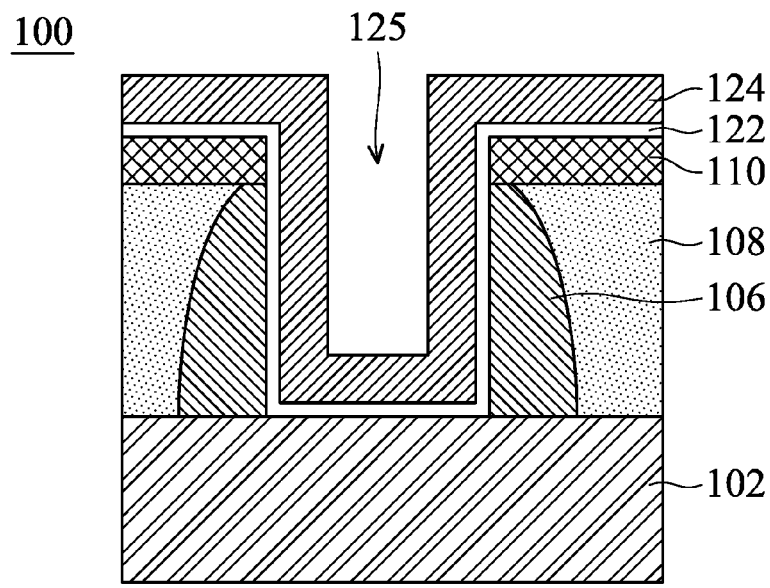
Figure 1F:
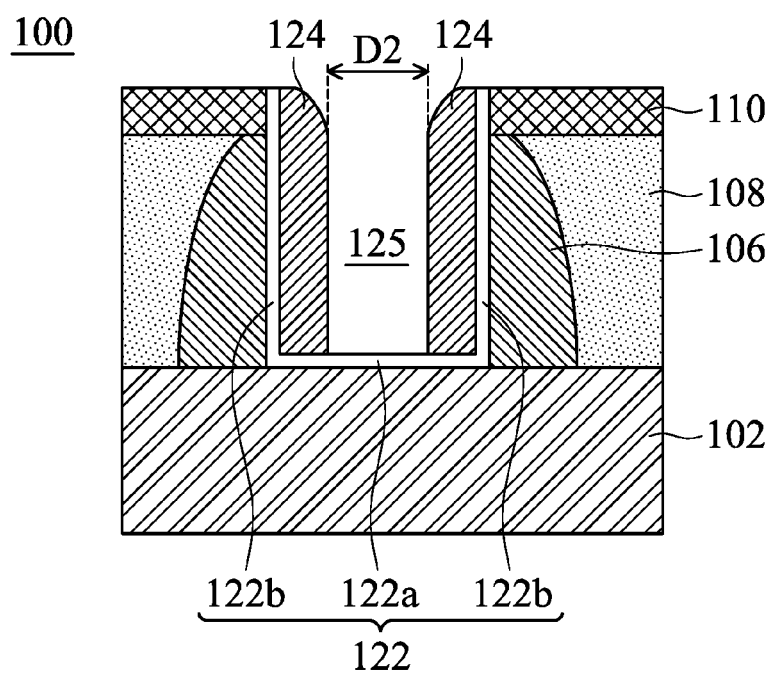

Referring to FIG. 1E, a first conductive type metal layer 124 is conformally formed on the gate dielectric layer 122. The first conductive type metal layer 124 may be formed by atomic layer deposition (ALD), chemical vapor deposition (CVD), or other acceptable methods. The first conductive type metal layer 124 has a thickness of about 4-20 nm, preferably about 4-10 nm.

In one embodiment, when the semiconductor device is a PMOS device, the first conductive type metal layer 124 is an $n^+$ metal layer.

In another embodiment, when the semiconductor device is NMOS device, the first conductive type metal layer 124 is a $p^+$ metal layer.

The $n^+$ metal layer has a work function of about 4.1-4.9 and comprises scandium (Sc), zirconium (Zr), hafnium (Hf), aluminum (Al), titanium, (Ti), tantalum (Ta) or niobium (Nb).

The $p^+$ metal layer has a work function of about 4.7-5.0 and comprises tungsten (W), platinum (Pt), ruthenium (Ru), molybdenum (Mo), titanium carbide (TiC), zirconium arbide (ZrC), tantalum carbide (TaC), tungsten carbide (WC), titanium nitride (TiN), tantalum nitride (TaN) or ruthenium oxide (RuO).

Referring to FIG. 1E, the first conductive type metal layer 124 and the gate dielectric layer 122 over the metal layer 110 is removed to form a gap 125 in the inter-layer dielectric layer 108 and to expose a portion of the gate dielectric layer 122.

Note that after the above removing step, the gate dielectric layer 122 has a U-shaped structure, and the U-shaped gate dielectric layer 122 comprises a horizontal portion 122a and two vertical portions 122b, and the two vertical portions 122b are located at opposite ends of the horizontal portion 122a. Two first conductive type metal layers 124 are adjacent to the vertical portions 122b of the U-shaped gate dielectric layer 122.

An etching process such as a dry etching technique (e.g., anisotropic etching) may be performed on the first conductivity type metal layer 124 such that a portion of the first conductivity type metal layer 124 remains on the sidewalls of horizontal portion 122a of the U-shaped gate dielectric layer 122.

The gap 125 has a width of D2, and the D1 of the trench 120 is larger than D2 of the gap 125.

Figure 1G:
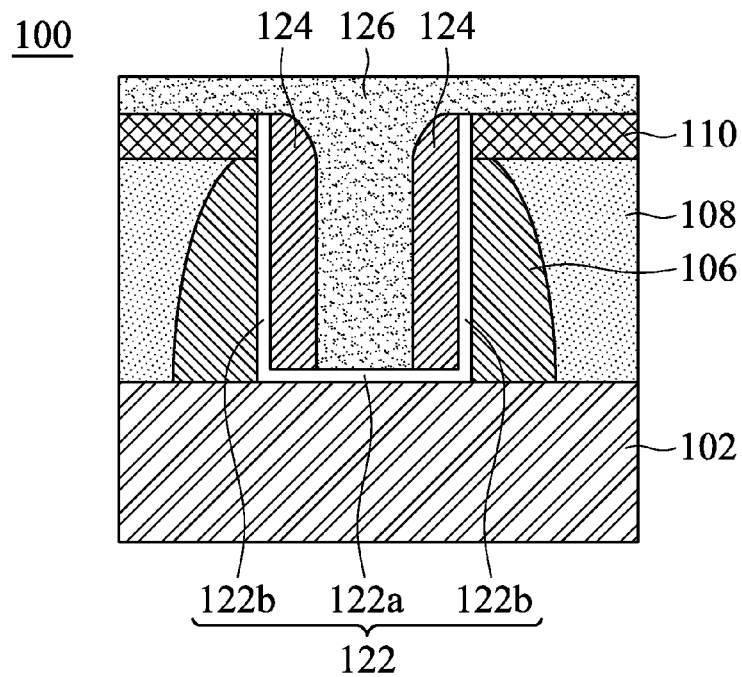

Referring to FIG. 1G, a second conductive type metal layer 126 is filled in the gap 125, and thus the second conductive type metal layer 126 is sandwiched between two first conductive type metal layers 124 to form a dual work function metal gate layer 130.

In one embodiment, when the semiconductor device is a PMOS device, the first conductive type metal layer 124 is an $n^+$ metal layer, and the second conductive type metal layer 126 is a $p^+$ metal layer.

In another embodiment, when the semiconductor device is an NMOS device, the first conductive type metal layer 124 is a $p^+$ metal layer, and the second conductive type metal layer 126 is an $n^+$ metal layer.

Figure 1H:
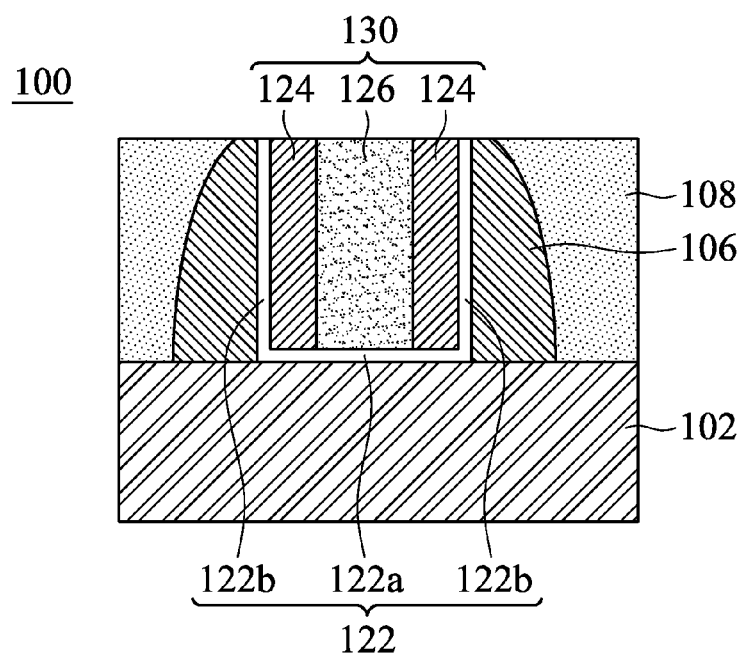
Figure 1H:
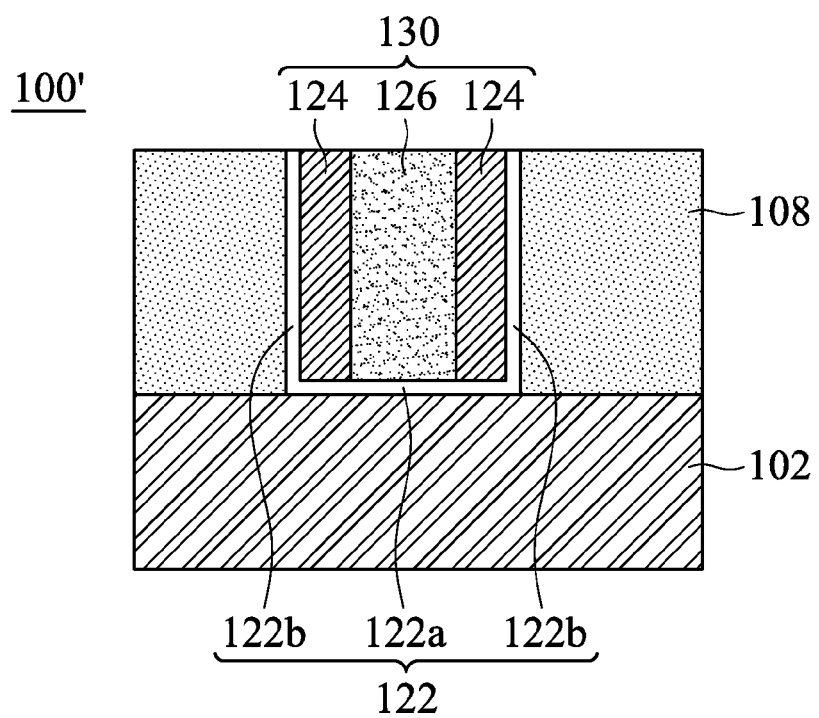

Referring to FIG. 1H, a second chemical mechanical polishing (CMP) is performed to the second conductive type metal layer 126 and the metal layer 110 to expose an upper surface of the dual work function metal gate layer 130. Thus, a semiconductor device 100 having the dual work function metal gate layer 130 is formed by the above-mentioned steps.

As shown in FIG. 1H, the invention also provides a semiconductor device 100 which comprises: a substrate 102; a U-shaped gate dielectric layer 122 formed on the substrate 102; and a dual work function metal gate layer 130 on the inner surface of U-shaped gate dielectric layer 122, wherein the dual work function metal gate layer 130 comprises a first conductive type metal layer 124 and a second conductive type metal layer 126. In another embodiment, the invention also provides a semiconductor device 100', as shown in FIG. 1H'. The semiconductor device 100' shown in FIG. 1H' is similar to the semiconductor device 100 shown in FIG. 1H, except that the semiconductor device 100' does not comprise the spacers. As shown in FIG. 1H', the inter-layer dielectric layer 108 is formed on the sidewalls of the U-shaped gate dielectric layer 122.

The U-shaped gate dielectric layer 122 comprises a horizontal portion 122a and two vertical portions 122b, and the two vertical portions 122b are located at opposite ends of the horizontal portion 122a. Additionally, the dual work function metal gate layer 130 comprises two first conductive type metal layers 124 adjacent to the vertical portions 122b of the U-shaped gate dielectric layer 122 and the second conductive type metal layer 126 sandwiched between two first conductive type metal layers 124.

For example, when the semiconductor device is a PMOS device, the first conductive type metal layer 124 is an $n^+$ metal layer, and the second conductive type metal layer 126 is a $p^+$ metal layer. In other words, the $p^+$ metal layer sandwiched between two $n^+$ metal layers. Because the middle $p^+$ metal layer has a higher work function, the dual work function metal gate layer 130 has a higher threshold voltage ($V_{th}$) for the p-channel below the middle $p^+$ metal layer. Because the n+ metal layer has a lower work function, the undesirably gate-induced drain leakage (GIDL) between the n+ metal layer and the drain (not shown in figures) is reduced.

From the above description, compared with the single work function metal gate in prior art, due to the dual work function metal gate layer of the invention having two different work functions, the threshold voltage (Vth) is increased and the gate-induced drain leakage (GIDL) is reduced.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a substrate;
   forming a dummy gate on the substrate;
   forming an inter-layer dielectric layer (ILD) on the dummy gate and the substrate;
   performing a first chemical mechanical polishing (CMP) process to the inter-layer dielectric layer (ILD) to expose an upper surface of the dummy gate;
   forming a metal layer on the upper surface of the dummy gate;
   removing the dummy gate to form a trench in the inter-layer dielectric layer (ILD);
   conformally forming a gate dielectric layer in the trench;
   conformally forming a first conductive type metal layer on the gate dielectric layer;
   anisotropic etching the first conductive type metal layer and the gate dielectric layer over the metal layer to form a gap in the inter-layer dielectric layer (ILD) and to expose a portion of the gate dielectric layer, wherein the first conductive type metal layer is divided into two first conductive type metal layers defining the gap;
   filling a second conductive type metal layer in the gap, wherein the second conductive type metal layer is sandwiched between the two first conductive type metal layers to form a dual work function metal gate layer, wherein the two first conductive type metal layers are n+ metal layers and the second conductive type metal layer is a p+ metal layer, and wherein the first conductive type metal layer and the second conductive type metal layer both directly contact the gate dielectric layer; and
   performing a second chemical mechanical polishing (CMP) process to the second conductive type metal layer and the metal layer to expose an upper surface of the dual work function metal gate layer.

2. The method for fabricating a semiconductor device as claimed in claim 1, before forming the inter-layer dielectric layer (ILD) on the dummy gate and the substrate, further comprising:
   forming a spacer on a sidewall of the dummy gate.

3. The method for fabricating a semiconductor device as claimed in claim 1, wherein the metal layer comprises p+ metal layer or n+ metal layer.

4. The method for fabricating a semiconductor device as claimed in claim 1, wherein the n+ metal layer has a work function of about 4.1-4.9.

5. The method for fabricating a semiconductor device as claimed in claim 1, wherein the n+ metal layer comprises scandium (Sc), zirconium (Zr), hafnium (Hf), aluminum (Al), titanium, (Ti), tantalum (Ta) or niobium (Nb).

6. The method for fabricating a semiconductor device as claimed in claim 1, wherein the p+ metal layer has a work function of about 4.7-5.0.

7. The method for fabricating a semiconductor device as claimed in claim 1, wherein the p+ metal layer comprises tungsten (W), platinum (Pt), ruthenium (Ru), molybdenum (Mo), titanium carbide (TiC), zirconium arbide (ZrC), tantalum carbide (TaC), tungsten carbide (WC), titanium nitride (TiN), tantalum nitride (TaN) or ruthenium oxide (RuO).

8. The method for fabricating a semiconductor device as claimed in claim 1, wherein a width of the trench is larger than that of the gap.

9. The method for fabricating a semiconductor device as claimed in claim 1, wherein the gate dielectric layer comprises high-k dielectric material.

10. The method for fabricating a semiconductor device as claimed in claim 9, wherein the high-k dielectric material comprises $HfO_2$, $ZrO_2$, $TiO_2$, $Al_2O_3$, HfSiO, HfSiON, HfTaO, HfTiO, HfZrO or combinations thereof.

11. The method for fabricating a semiconductor device as claimed in claim 1, wherein after removing the first conductive type metal layer and the gate dielectric layer over the metal layer, the gate dielectric layer has a U-shaped structure, and the U-shaped gate dielectric layer comprises a horizontal portion and two vertical portions, and the two vertical portions are located at opposite ends of the horizontal portion.

12. The method for fabricating a semiconductor device as claimed in claim 11, wherein two first conductive type metal layers are adjacent to the vertical portions of the U-shaped gate dielectric layer.

13. The method for fabricating a semiconductor device as claimed in claim 11, wherein the inter-layer dielectric layer (ILD) is further formed on a sidewall of the U-shaped gate dielectric layer.

14. The method for fabricating a semiconductor device as claimed in claim 11, wherein the inter-layer dielectric layer (ILD) surrounds the U-shaped gate dielectric layer.

15. The method for fabricating a semiconductor device as claimed in claim 4, further comprising:

forming a spacer on the substrate, wherein the spacer is formed between the inter-layer dielectric layer (ILD) and the U-shaped gate dielectric layer.

* * * * *